(12) United States Patent
Dor et al.

(10) Patent No.: US 11,184,029 B1
(45) Date of Patent: Nov. 23, 2021

(54) LOW POWER ECC FOR EUFS

(71) Applicant: SAMSUNG ELECTRONICS CO., LTD., Suwon-si (KR)

(72) Inventors: Avner Dor, Kfar-Saba (IL); Amit Berman, Binyamina (IL); Ariel Doubchak, Herzliya (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/885,772

(22) Filed: May 28, 2020

(51) Int. Cl.
*H03M 13/13* (2006.01)
*H03M 13/11* (2006.01)
*G06F 7/544* (2006.01)
*H03M 13/29* (2006.01)

(52) U.S. Cl.
CPC ........ *H03M 13/132* (2013.01); *G06F 7/5443* (2013.01); *H03M 13/1105* (2013.01); *H03M 13/1191* (2013.01); *H03M 13/2942* (2013.01)

(58) Field of Classification Search
CPC .................. H03M 13/132; H03M 13/1105
See application file for complete search history.

(56) References Cited

U.S. PATENT DOCUMENTS

2005/0149832 A1* 7/2005 Liberol ............... H03M 13/159
714/781

OTHER PUBLICATIONS

Abdul-Sattar, Ruaa; Hussein, Nada and M. Ali, Nada; Lookup Table Algorithm for Error Correction in Color Images; vol. 2, 10.30630/joiv.2.2.113, JOIV : International Journal on Informatics Visualization, Jul. 2018 (Year: 2018).*

* cited by examiner

*Primary Examiner* — Joseph D Torres
(74) *Attorney, Agent, or Firm* — F. Chau & Associates, LLC

(57) ABSTRACT

Systems and methods are described for low power error correction coding (ECC) for embedded universal flash storage (eUFS) are described. The systems and methods may include identifying a first element of an algebraic field; generating a plurality of lookup tables for multiplying the first element; multiplying the first element by a plurality of additional elements of the algebraic field, wherein the multiplication for each of the additional elements is performed using an element from each of the lookup tables; and encoding information according to an ECC scheme based on the multiplication.

19 Claims, 8 Drawing Sheets

LOW POWER ECC FOR EUFS

BACKGROUND

The following relates generally to error correction coding (ECC), and more specifically to low power ECC for embedded universal flash storage (eUFS).

ECC techniques are commonly used in a variety of communications systems, including memory devices, to recover data in the presence of noise and other errors introduced by a communication channel. For example, when data is read from memory, some of the retrieved bits may not correspond to the bits originally programmed to the memory. ECC encoding can be used to recover the original bits.

However, in many cases, ECC techniques can be computationally intensive, and may consume a significant amount of power. This may be especially problematic for low power devices. Therefore, there is a need in the art for efficient ECC methods.

SUMMARY

A method, apparatus, non-transitory computer readable medium, and system for low power error correction coding (ECC) for embedded universal flash storage (eUFS) are described. Embodiments of the method, apparatus, non-transitory computer readable medium, and system may include identifying a first element of an algebraic field; generating a plurality of lookup tables for multiplying the first element; multiplying the first element by a plurality of additional elements of the algebraic field, wherein the multiplication for each of the additional elements is performed using an element from each of the lookup tables; and encoding information according to an ECC scheme based on the multiplication.

A method, apparatus, non-transitory computer readable medium, and system for low power ECC for EUFS are described. Embodiments of the method, apparatus, non-transitory computer readable medium, and system may identify a first element of an algebraic field, generate a plurality of lookup tables for multiplying the first element, split a second element of the algebraic field into a plurality of sub-elements, wherein a number of the sub-elements equals a number of the lookup tables, identify a summation term from each of the plurality of lookup tables based on each of the plurality of sub-elements, compute a product of the first element and the second element by summing each of the summation terms, and decode information based on the product of the first element and the second element.

An apparatus, system, and method for low power ECC for EUFS are described. Embodiments of the apparatus, system, and method may include a processor, a memory, a table generation component configured to generate a plurality of lookup tables for multiplying a first element, a lookup component configured to split a second element of an algebraic field into a plurality of sub-elements, and identify a summation term from each of the plurality of lookup tables based on each of the plurality of sub-elements, a multiplication component configured to compute a product of the first element and the second element by summing each of the summation terms, and an encoder configured to encode information based on the product of the first element and the second element.

BRIEF DESCRIPTION OF THE DRAWINGS

Features of the present inventive concept will become more apparent by describing in detail exemplary embodiments thereof with reference to the accompanying drawings.

DETAILED DESCRIPTION

Figure 1:
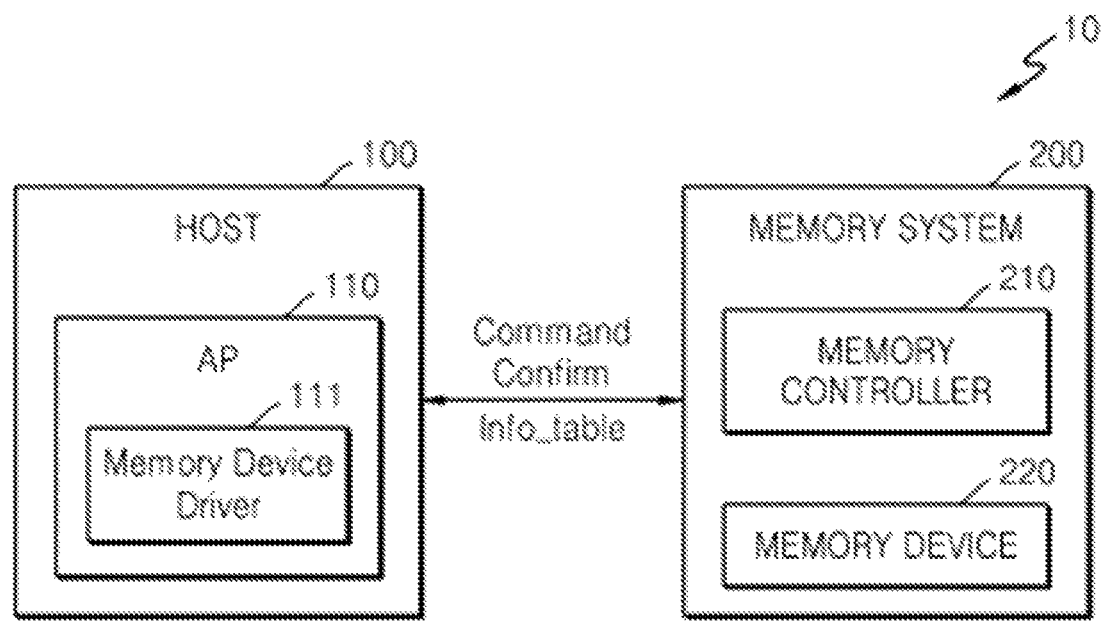
FIG. 1 is a block diagram illustrating an implementation of a data processing system including a memory system, according to an exemplary embodiment of the inventive concept.

The present disclosure describes systems and methods for error correction, and more specifically for low power error correction coding (ECC). ECC may be used for controlling errors in data over unreliable or noisy communication channels. For example, redundant information may be included in a signal that identification and recovery of inaccurate information.

ECC operations may include a large number of mathematical computations that can impose significant demands on hardware. For example, computing products of a finite field can be computationally intensive. In algebraic ECC such as Reed Solomon (RS), Bose-Chaudhuri-Hocquenghem (BCH), polar codes and RS list decoders, a large percentage of the products are recurring products. In some cases, algebraic ECC may involve a scalar that multiplies several other scalars and are performed in a straightforward manner, contributing to cost. The present disclosure enables a reduction in cost of computing the recurring products.

Embodiments of the present disclosure may include performing ECC by identifying a first element of a finite field that is expected to be multiplied a number of times, generating multiple lookup tables based on the identified element, identifying a second element of the field to be multiplied by the first element, looking up an item from each of the lookup tables based on the second element, and computing the product of the first element and the second element by summing the items from the lookup table. The lookup tables may be reused multiple times before another element is identified that will be the basis of subsequent multiplications.

An encoder is a logic circuit used to convert binary information from inputs to unique outputs. A decoder is a logic circuit used to convert binary information from coded inputs to unique outputs. Multiple inputs and multiple outputs may be used. Channel coding performs encoding and decoding operations on a data stream to correct communication errors such as interference or noise. Channel coding is performed on a first data stream with a first set of operations a transmitting device and a second data stream with a second set of operations at a receiving device. In some cases, channel coding may be based on a block code or a convolutional code.

In some cases, the low power encoding techniques described herein may be implemented within a NAND memory device. NAND programming is a complex process based on applying a voltage to a memory cell. However, cell voltage may be affected by variables such as current voltage level, pulse power, and inter cell interferences. Cell voltage may also be affected by inhibited cell disruption, inter word-line (WL) coupling, and cell retention. Additionally, the outcome of writing to a NAND device can be stochastic. For example, data may also be noisy, leading to problems with observation.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Exemplary Memory System

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the memory system 200. The host 100 may communicate with the memory system 200 to transmit a command related to a memory operation and receive a confirm command in response to the transmitted command. The host 100 may also communicate with the memory system 200 with regard to an information table related to the memory operation.

The memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
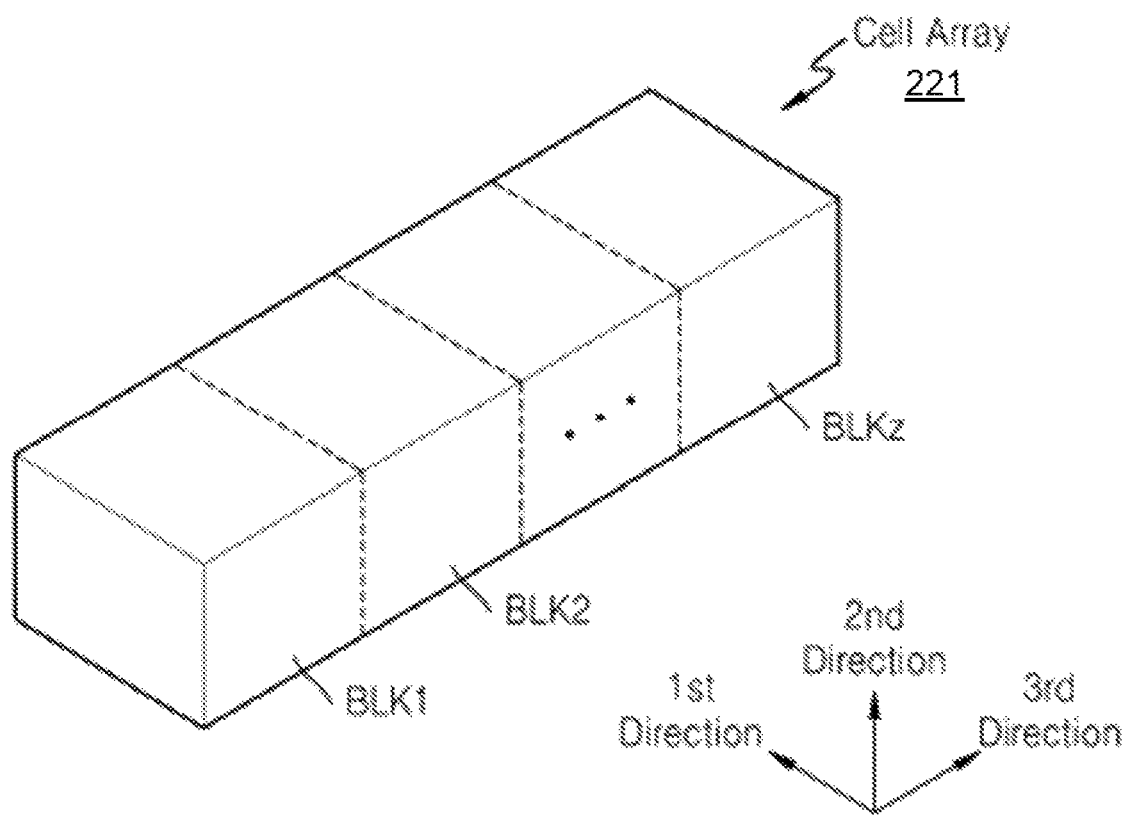
FIG. 4 is a block diagram of the memory cell array of FIG. 2, according to an exemplary embodiment of the inventive concept.

The memory device 220 includes a memory cell array that retains data stored therein, even when the memory device 220 is not powered on. The memory cell array may include as memory cells, for example, a NAND or NOR flash memory, a magneto-resistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
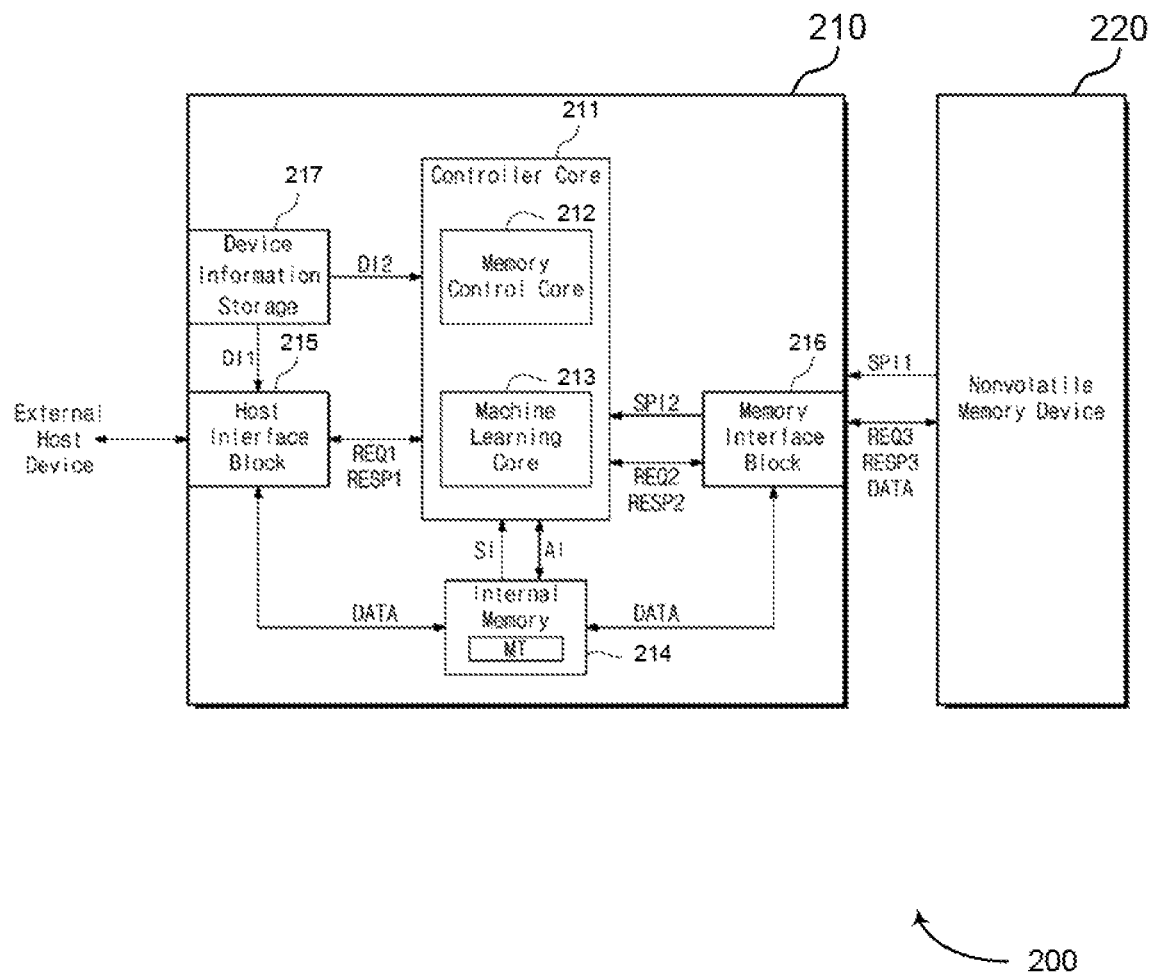
FIG. 2 is a block diagram illustrating the memory system of FIG. 1, according to an exemplary embodiment of the inventive concept.

FIG. 2 is a block diagram illustrating the memory system 200 of FIG. 1, according to an exemplary embodiment of the inventive concept.

Referring to FIG. 2, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 211, an internal memory 214, a host interface block 215, and a memory interface block 216. The memory controller 210 may also include a device information storage 217 configured provide first device information DI' to the host interface block 215 and second device information DI2 to the controller core 211.

The controller core 211 may include a memory control core 212 and a machine learning core 213, and each of these cores may be implemented by one or more processors. The memory control core 212 may control and access the memory device 220 depending on a request received from the host 100 or an internally designated schedule. The memory control core 212 may manage and execute various metadata and codes used to manage or operate the memory system 200.

The machine learning core 213 may be used to perform training and inference of a neural network that is designed to perform noise cancellation on the memory device 220, as described in further detail below.

The internal memory 214 may be used, for example, as a system memory which is used by the controller core 211, a cache memory which stores data of the memory device 220, or a buffer memory which temporarily stores data between the host 100 and the memory device 220. The internal memory 214 may store a mapping table MT that indicates a relationship between logical addresses assigned to the memory system 200 and physical addresses of the memory device 220. The internal memory 214 may include, for example, a DRAM or an SRAM.

In an exemplary embodiment, a neural network may be included in a computer program which is stored in the internal memory 214 of the memory controller 210 or in the memory device 220. The computer program including the neural network may be executed by the machine learning core 213 to denoise data stored in the memory device 220. Thus, according to exemplary embodiments, the memory system 200 may denoise the data stored in the memory device 220 during a normal read operation of the memory device 220. That is, after manufacture of the memory system 200 is complete, during normal operation of the memory system 200, and particularly, during a normal read operation of the memory system 200 in which data is read from the memory device 220, the data stored in the memory device 220 that is being read may be denoised using the neural network locally stored and executed in the memory system 200, and the denoised data may be read out from the memory device 220.

The host interface block 215 may include a component for communicating with the host 100 such as, for example, a physical block. The memory interface block 216 may include a component for communicating with the memory device 220 such as, for example, a physical block.

Below, an operation of the memory system 200 over time will be described. When power is supplied to the memory system 200, the memory system 200 may perform initialization with the host 100.

The host interface block 215 may provide the memory control core 212 with a first request REQ1 received from the host 100. The first request REQ1 may include a command (e.g., a read command or a write command) and a logical address. The memory control core 212 may translate the first request REQ1 to a second request REQ2 suitable for the memory device 220.

For example, the memory control core 212 may translate a format of the command. The memory control core 212 may obtain address information AI with reference to the mapping table MT stored in the internal memory 214. The memory control core 212 may translate a logical address to a physical address of the memory device 220 by using the address information AI. The memory control core 212 may provide the second request REQ2 suitable for the memory device 220 to the memory interface block 216.

The memory interface block 216 may register the second request REQ2 from the memory control core 212 at a queue. The memory interface block 216 may transmit a request that is first registered at the queue to the memory device 220 as a third request REQ3.

When the first request REQ1 is a write request, the host interface block 215 may write data received from the host 100 to the internal memory 214. When the third request REQ3 is a write request, the memory interface block 216 may transmit data stored in the internal memory 214 to the memory device 220.

When data is completely written, the memory device 220 may transmit a third response RESP3 to the memory interface block 216. In response to the third response RESP3, the memory interface block 216 may provide the memory control core 212 with a second response RESP2 indicating that the data is completely written.

After the data is stored in the internal memory 214 or after the second response RESP2 is received, the memory control core 212 may transmit a first response RESP1 indicating that the request is completed to the host 100 through the host interface block 215.

When the first request REQ1 is a read request, the read request may be transmitted to the memory device 220 through the second request REQ2 and the third request REQ3. The memory interface block 216 may store data received from the memory device 220 in the internal memory 214. When data is completely transmitted, the memory device 220 may transmit the third response RESP3 to the memory interface block 216.

As the third response RESP3 is received, the memory interface block 216 may provide the memory control core 212 with the second response RESP2 indicating that the data is completely stored. As the second response RESP2 is received, the memory control core 212 may transmit the first response RESP1 to the host 100 through the host interface block 215.

The host interface block 215 may transmit data stored in the internal memory 214 to the host 100. In an exemplary embodiment, in the case in which data corresponding to the first request REQ1 is stored in the internal memory 214, the transmission of the second request REQ2 and the third request REQ3 may be omitted.

The memory device 220 may also transmit first Serial Peripheral Interface information SPI1 to the memory interface block 216. The memory interface block 216 may transmit second Serial Peripheral Interface information SPI2 to the controller core 211.

Figure 3:
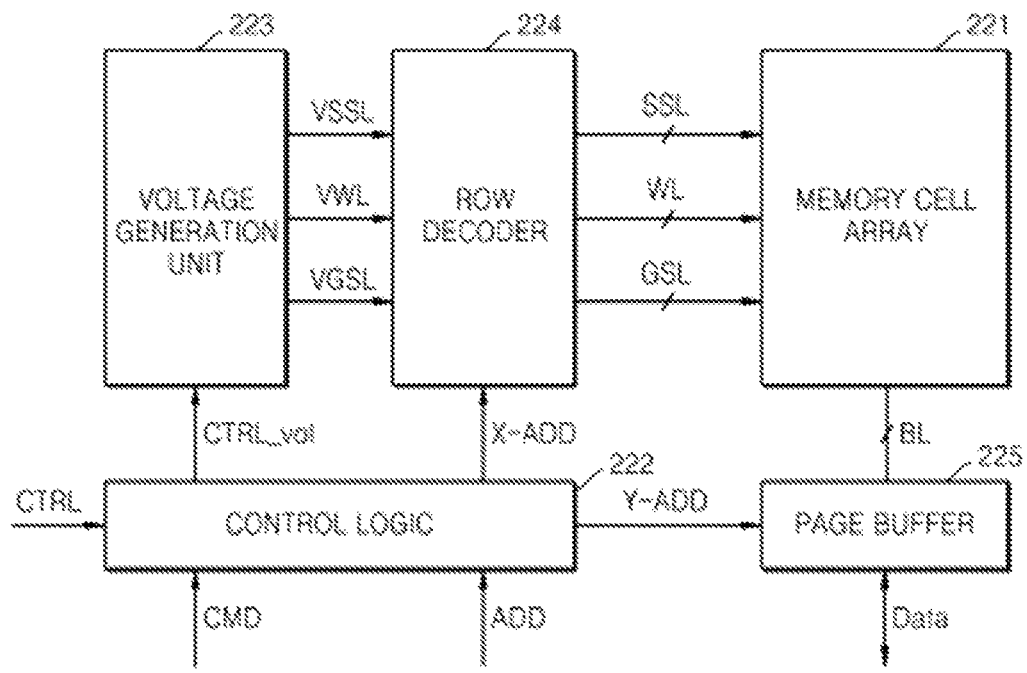
FIG. 3 is a detailed block diagram of a non-volatile memory device of FIG. 1, according to an exemplary embodiment of the inventive concept.

FIG. 3 is a detailed block diagram of the non-volatile memory device 220 of FIG. 1, according to an exemplary embodiment of the inventive concept. Referring to FIG. 3, the memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 5:
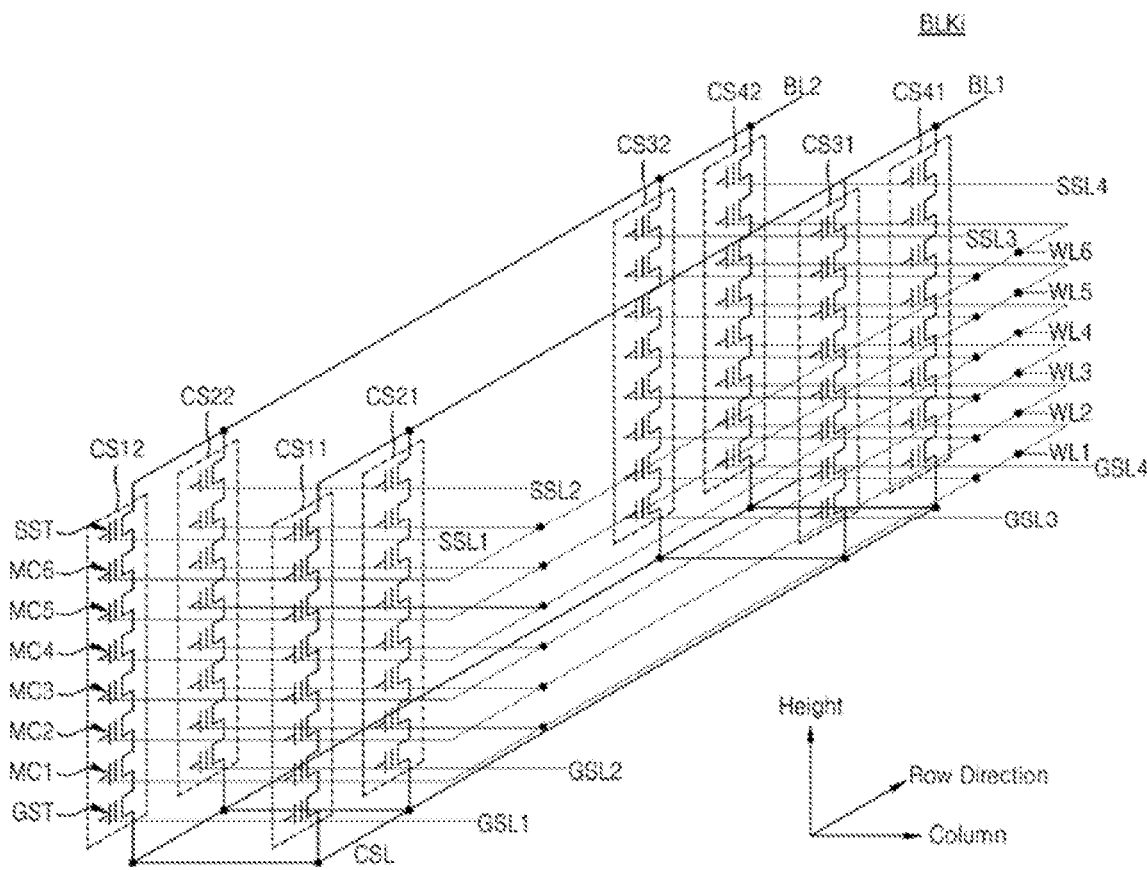
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4. The number of wordlines and memory cells shown in FIG. 5 is just an example, and any suitable number of wordlines and memory cells may be used.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Memory Device

Figure 6:
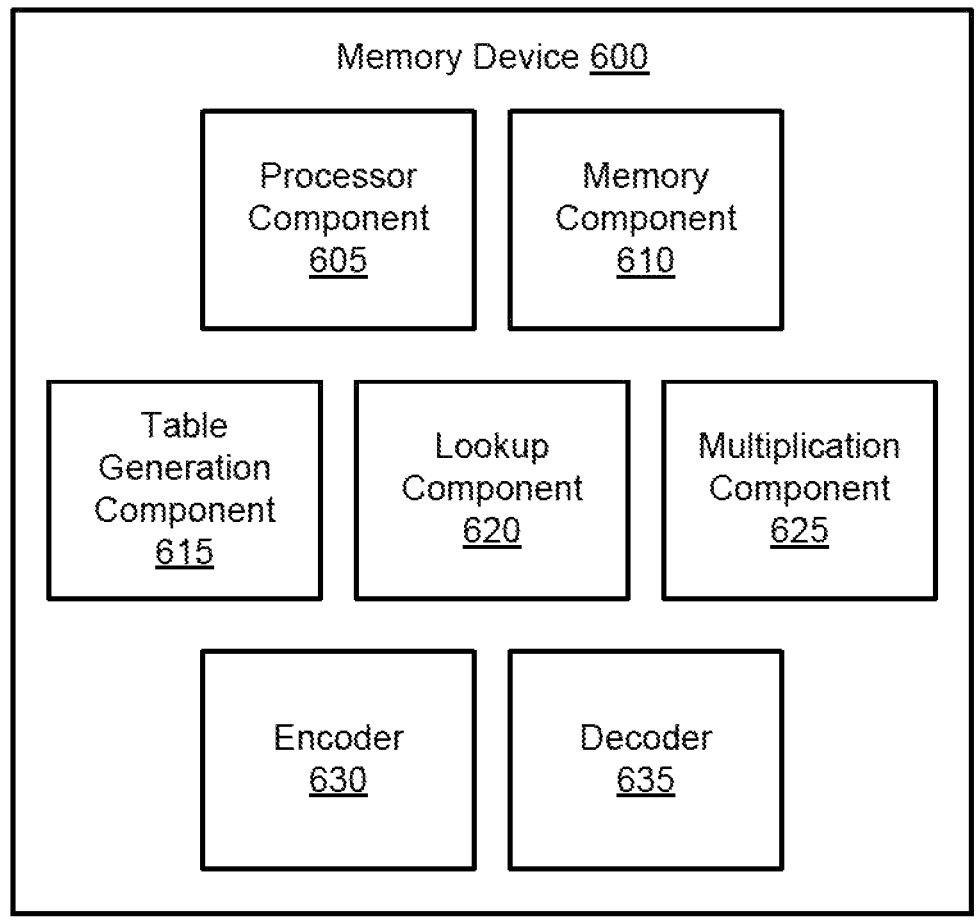
FIG. 6 shows an example of a memory device according to aspects of the present disclosure.

FIG. 6 shows an example of a memory device according to aspects of the present disclosure. Memory device 600 may include processor component 605, memory component 610, table generation component 615, lookup component 620, multiplication component 625, encoder 630, and decoder 635. According to some embodiments, memory device may comprise a NAND flash memory device as described with reference to FIGS. 1-5.

Processor component 605 may include an intelligent hardware device, (e.g., a general-purpose processing component, a digital signal processor (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor may be configured to operate a memory array using a memory controller. In other cases, a memory controller may be integrated into the processor. The processor may be configured to execute computer-readable instructions stored in a memory to perform various functions. In some examples, a processor may include special purpose components for modem processing, baseband processing, digital signal processing, or transmission processing. In some examples, the processor may comprise a system-on-a-chip.

Memory component 610 may store information for various programs and applications on a computing device. For example, the storage may include data for running an operating system. The memory may include both volatile memory and non-volatile memory. Volatile memory may include random access memory (RAM), and non-volatile memory may include read-only memory (ROM), flash memory, electrically erasable programmable read-only memory (EEPROM), digital tape, a hard disk drive (HDD), and a solid state drive (SSD). Memory may include any combination of readable and/or writable volatile memories and/or non-volatile memories, along with other possible storage devices. Memory component 610 may program the encoded information to a memory.

Table generation component 615 may identify a first element of a field, and generate a set of lookup tables for multiplying the first element. In some examples, the set of lookup tables are generated using a Gray code. In some examples, the number of the set of lookup tables is based on a number of bits of the first element. The first element may be identified based on an encoding algorithm of the ECC, based on information to be encoded, or both.

Lookup component 620 may identify a summation term from each of the set of lookup tables based on each of the set of sub-elements identified based on a second element. In some examples, the summation term is identified from each of the set of tables using a corresponding sub-element of the set of sub-elements as an index.

Lookup component 620 may identify a summation term from each of the set of lookup tables based on each of the set of sub-elements. In some cases, lookup component 620 may be configured to split a second element of the field into a plurality of sub-elements, and identify a summation term from each of the plurality of lookup tables based on each of the plurality of sub-elements.

Multiplication component 625 may identify a first element and a second element to be multiplied, and split the second element into a set of sub-elements, where a number of the sub-elements equals a number of the lookup tables. Multiplication component 625 may compute a product of the first element and the second element by summing each of the summation terms identified from the set of lookup tables. In some examples, a number of bits of the first element is equal to a number of bits of the second element.

Multiplication component 625 may also identify subsequent elements to be multiplied by the first element, and compute a product of the first elements and each of the subsequent elements using the process described with reference to the second element.

Encoder 630 may encode information based on the product of the first element and the second element. In some examples, the encoding is based on an algebraic ECC scheme. Encoder 630 may be configured to encode information based on the product of the first element and the second element.

Decoder 635 may decode information based on the product of the first element and the second element. Decoder 635 may be configured to decode information based on an output of the multiplication component 625.

Low Power Error Correction

Figure 7:
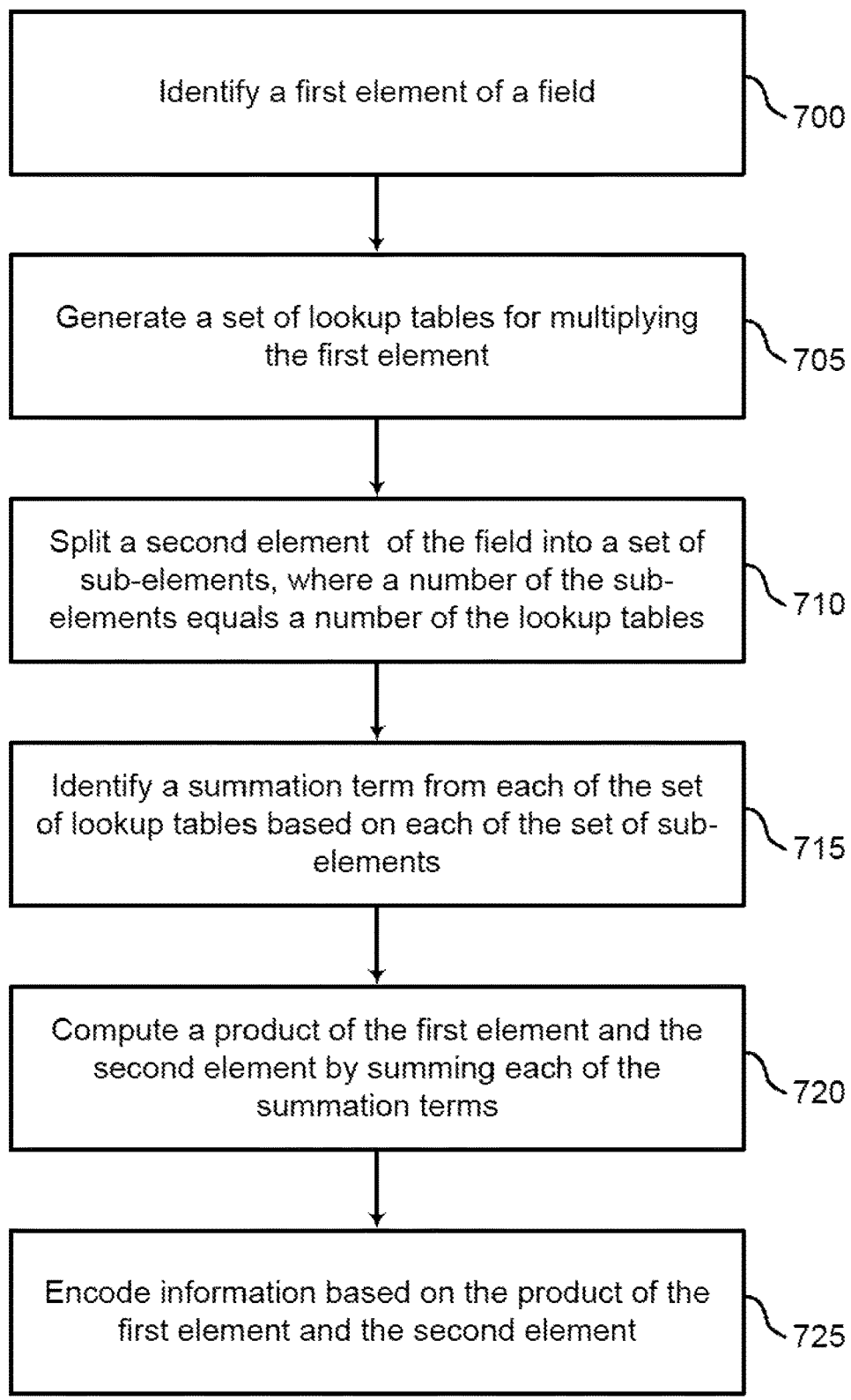
FIG. 7 shows an example of an encoding process according to aspects of the present disclosure.

FIG. 7 shows an example of an encoding process according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

The present disclosure considers a first element $\beta$ in a field (e.g., a finite field), where it is anticipated that $\beta$ will be used to multiply numerous other elements of the same field. In the following scheme a processor forms two or more small look-up-tables (LUTs) of elements from F. These tables depend on $\beta$. Each product of the first element and a second element of the field, of $\beta \cdot \gamma (\gamma \in F)$, is performed by a read function from each table, then adding the read scalars. Therefore, the product is reduced to LUT access and addition. This enables a reduction in overall cost of hardware (HW) and design complexity. A process of one element that multiplies numerous other elements is common in algebraic error correction codes (ECC).

Algebraic ECC functions, such as Bose-Chaudhuri-Hocquenghem (BCH) code or Reed Solomon (RS) codes, include list decoders and various GNU Complier Collection (GCC) codes using the same scalar to multiply other scalar variables. For example, Let $F=GF(2^r)$ and $\beta \in F^*$. Variable $\beta$ is then multiplied by elements of the field F. Initially, the processor produces small lookup tables (LUTs) composed of elements from F. The LUTs are based on $\beta$.

Each computation of $\beta \cdot \gamma (\gamma \in F)$ may be performed by a read from each table, and then adding the read scalars. For example, when there are two tables, the computation of $\beta \cdot \gamma$ uses 2 small-table reads and r XORs. In conventional methods, such product uses $r^2$ XORs. An increase in the number of tables may reduce the overall cost of a table search, while increasing arithmetic complexity.

The following describes an embodiment comprising two tables. However, this can generalized to any number of tables. Let $F=GF(2^r)$ and $\beta \in F \backslash \{0\}$ where $\beta$ is multiplied by numerous different elements of the field F. A primitive polynomial of degree r: $p(x)=\Sigma_{0 \le i \le r} \alpha_i \cdot x^i$ ($\alpha_i \in GF(2)$) is fixed, such that the polynomial hamming weight $ham(p(x))$ is minimal and set r' equal to $ham(p(x))-1$, where r'=2 is obtainable in many common applications (e.g. r=10). Also, $\alpha_0 = a_r = 1$.

Set $\alpha \in F$ (a root of $p(x)$) and observe that:

$$\alpha^r = \Sigma_{0 \le i \le r-1} a_i \cdot \alpha^i \text{ and } \alpha^{-1} = \Sigma_{0 \le i \le r-1} a_{i+1} \cdot \alpha^i \quad (1)$$

There are r' nonzero coefficients in the right side of both equations. An arbitrary element such as $\beta \in F^*$ may be used to consider the binary representation with respect to the basis of F over GF(2), $\{1, \alpha, \ldots, \alpha^{r-1}\}$:

$$\beta = \Sigma_{0 \le i \le r-1} \beta_i \alpha^i \quad (2)$$

where $\beta_i \in GF(2)$, and $ham\alpha(\beta) = ham(\beta_0, \ldots, \beta_{r-1})$.

Also, note that:

$$\beta \cdot \alpha = \Sigma_{0 \le i \le r-1} \beta_i \cdot \alpha^{i+1} = \Sigma_{0 \le i \le r-2} \alpha^{i+1} + \beta_{r-1} \cdot \Sigma_{0 \le i \le r-1} \alpha_i \cdot \alpha^i \quad (3)$$

Therefore, a cyclic shift and r' GF(2) additions are used for the computation of $\beta \cdot \alpha$, when $\beta_{r-1}=1$. When $\beta_{r-1}=0$ (for half the fields elements), there are no additions. Likewise, $$\beta \cdot \alpha^{-1} = \Sigma_{0 \le i \le r-1} \beta_i \cdot \alpha^{i-1} = \Sigma_{1 \le i \le r-1} \beta_i \cdot \alpha^{i-1} + \beta_0 \cdot \Sigma_{0 \le i \le r-1} a_{i+1} \cdot \alpha^i \quad (4)$$

Therefore, a cyclic shift and r' GF(2) additions are used for the computation of $\beta \cdot \alpha^{-1}$, when $\beta_0=1$. When $\beta_0=0$ (i.e., for half the field's elements), there are no additions.

Thus, at operation 700, the system identifies a first element of a field (i.e., $\beta$). In some cases, the operations of this step may refer to, or be performed by, a table generation component as described with reference to FIG. 6. The first element may be identified based on an encoding algorithm used for ECC, on information received to be encoded, or both. In some cases, the system may identify the first element as an element that is likely to be multiplied a large number of times based on the ECC coding scheme being used, the algorithm used for the ECC, or the information to be encoded (or decoded).

At operation 705, the system generates a set of lookup tables for multiplying the first element. In some cases, the operations of this step may refer to, or be performed by, a table generation component as described with reference to FIG. 6.

The LUTs may be constructed using F-scalars, denoted by $T_i = T_i(\beta)$ for i=0, 1, 2. Variable $T_0$ is a temporary table that becomes immersed in tables $T_1$ and $T_2$. Once the processor computes these tables each product by $\beta$ is done by reading one element from $T_1$ and one from $T_2$ and adding them together. Therefore, when the tables are given the cost per product by $\beta$ is two LUT-accesses and r XORs as opposed to $r^2$ XORs in conventional technologies. The first step is the computation of the table with the following equation;

$$T_0 = \{\beta \cdot \alpha^i : 1 \le i \le r-1\} \quad (5)$$

Following equation 4 above, the mean cost is $r \cdot r'/2$ XORs.

Grey code is an ordering of the binary numeral system such that two successive values differ in one bit and the first element is the zero vector. In the construction of $T_1$ and $T_2$, Gray code may be used. When $T_0$ is given, $GF(2)^{\lfloor r/2 \rfloor}$ and $GF(2)^{\lceil r/2 \rceil}$ is ordered with a Gray code. According to the order, the following two tables are computed, which are linear subspaces over GF(2);

$$T_1 \equiv \left\{ \sum_{0 \le i < \frac{r}{2}} \beta \cdot \gamma_i \cdot \alpha^i : \gamma_i \in GF(2), 0 \le i < \frac{r}{2} \right\} \quad (6)$$

$$T_2 \equiv \left\{ \sum_{\frac{r}{2} \le i < r} \beta \cdot \gamma_i \cdot \alpha^i : \gamma_i \in GF(2), \frac{r}{2} \le i < r \right\} \quad (7)$$

Due to the Gray code, each element of these tables is computed with r XORs. The table $T_1$ may be indexed such that $$\sum_{0 \le i < \frac{r}{2}} \beta \cdot \gamma_i \cdot \alpha$$

is located at the address $(\gamma_0, \gamma_1, \ldots)$ and $T_2$ is indexed in a like manner. This indexing provides fast access to the lookup tables.

Also, $T_0$, $T_1$, $T_2$ satisfy the relation $T_0 \subseteq T_1 \cup T_2$. For an even r, $\sqrt[3]{T_1} = |T_2| = 2^{r/2}$, and for an odd r, $|T_1| = 2^{(r+1)/2}$ and $|T_2| = 2^{(r-1)/2}$. The arithmetic complexity of computing $T_1$ and $T_2$ is $C = |T_1| + |T_2|) \cdot r$ XORs. Variable C may also be the total size of $T_1$ and $T_2$ in bits. E.g. for r=10, C=640.

At operation 710, the system splits a second element of the field (i.e., $\gamma$) into a set of sub-elements (i.e., $\gamma_i$), where the number of sub-elements equals the number of lookup tables. In some cases, the operations of this step may refer to, or be performed by, a multiplication component as described with reference to FIG. 6. The second element may be identified based on an encoding algorithm used for ECC, on information received to be encoded, or both. In some cases, the sub-elements may be ordered with an ordering corresponding to an ordering of the lookup tables.

At operation 715, the system identifies a summation term (i.e., one of the terms $$\sum_{0 \le i < \frac{r}{2}} \beta \cdot \gamma_i \cdot \alpha^i \bigg)$$

from each of the set of lookup tables based on each of the set of sub-elements. In some cases, the operations of this step may refer to, or be performed by, a lookup component as described with reference to FIG. 6. For example, each of the sub-elements (i.e., parts of the second element) may be used as a lookup index for a specific lookup table. For example, a first part of the second element may be used as an index for a first table and a second part of the second element may be used to lookup a term in a second lookup table, and so forth.

At operation 720, the system computes a product of the first element and the second element by summing each of the summation terms. In some cases, the operations of this step may refer to, or be performed by, a multiplication component as described with reference to FIG. 6.

When $N \sqrt[3]{} 1$ and using a recursion function, the scalars $\{\beta \cdot \alpha^i\}_{1 \le i \le N}$ are computed with a maximum of $N \cdot r'$GF(2) additions and an average (overall $\beta \in F$) of $N \cdot r'/2$ additions. Likewise, the scalars may be computed with $\{\beta \cdot \alpha^{-i}\}_{1 \le i \le N}$ with a maximum of $N \cdot r'$ GF(2) additions and an average (overall $\beta \in F$) of $N \cdot r'/2$ additions.

When $T_1$ and $T_2$ are computed, they may use an arbitrary element in F:

$$\gamma = \Sigma_{0 \le i \le r-1} \gamma_i \cdot \alpha^1 \text{ where}(\gamma_i \in GF(2)) \qquad (8)$$

where that $\beta \cdot \gamma$ can be broken down as follows:

$$\beta \cdot \gamma = \sum_{0 \le i < \frac{r}{2}} \beta \cdot \gamma_i \cdot \alpha^1 + \sum_{\frac{r}{2} \le i < r} \beta \cdot \gamma_i \cdot \alpha^1 \qquad (9)$$

Thus, product $\beta \cdot \gamma$ can be computed by multiple LUT-accesses and one or more F-additions.

At operation 725, the system encodes information based on the product of the first element and the second element. In some cases, the operations of this step may refer to, or be performed by, an encoder as described with reference to FIG. 6.

Thus, for integers r and s, where s≤r there are subspaces $V_1, V_2, \ldots, V_s$ of $F=GF(2^r)$ over GF(2) whose direct sum is F, and whose dimensions differ by no more than 1, wherein for a given target $\beta \in F$, the processor computes and stores the tables $T_1 = \beta \cdot V_1, T_2 = \beta \cdot V_2, \ldots, T_s = \beta \cdot V_s$ and thereby for every $v \in F$, the processor finds promptly $v_1, v_2, \ldots, v_s$ such that:

$$v = v_1 + v_2 + \ldots + v_s, \text{ and } v_i \in V_i(i \in [s]) \qquad (10)$$

Accordingly, the processor finds at an address provided by $v_i$: $\beta \cdot v_i \in T_i$ ($i \in [s]$). Therefore, with s−1 additions in F, the desired output is computed as:

$$\beta \cdot v = \beta \cdot v_1 + \beta \cdot v_2 + \ldots + \beta \cdot v_s \qquad (11)$$

Figure 8:
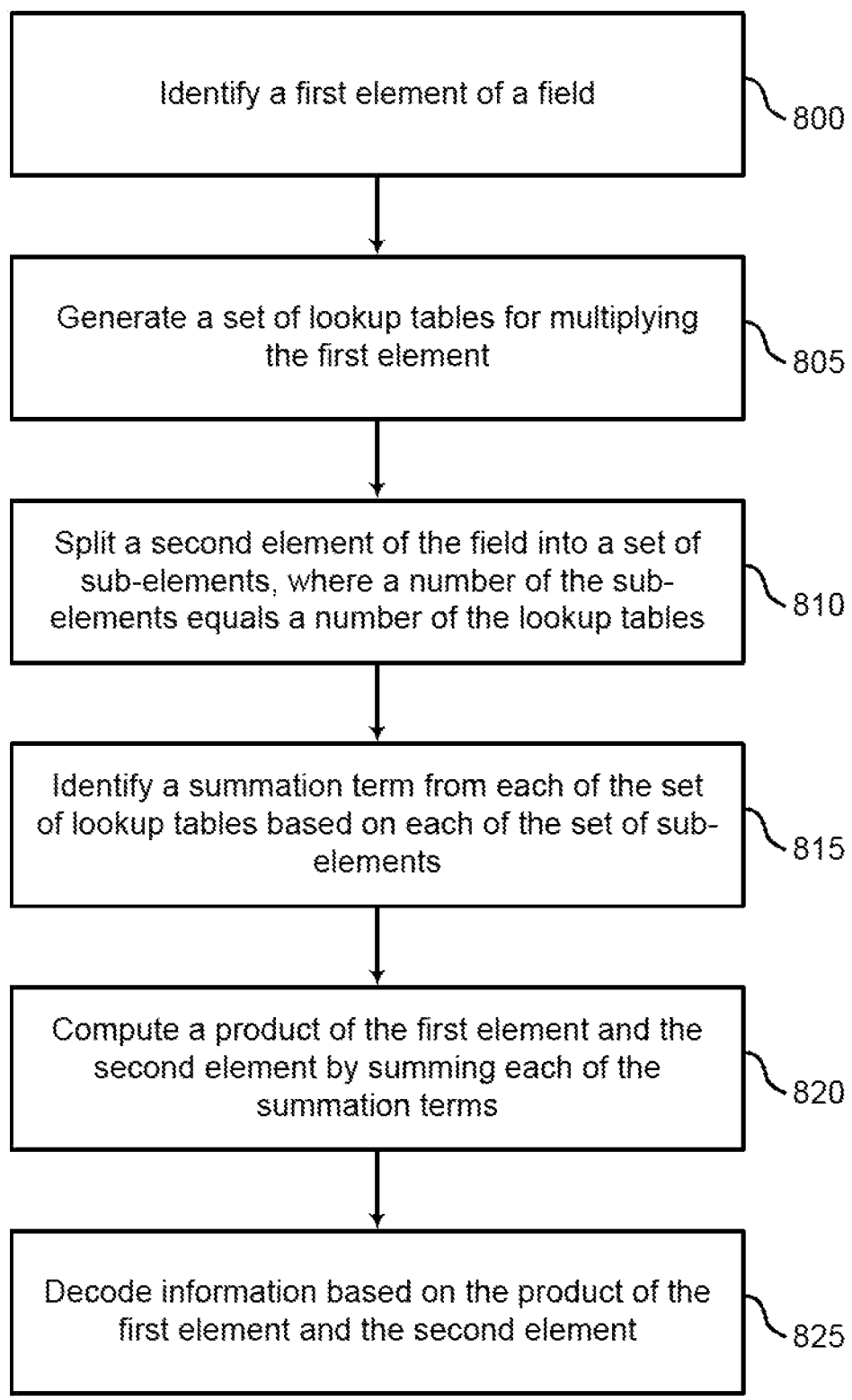
FIG. 8 shows an example of a decoding process according to aspects of the present disclosure.

FIG. 8 shows an example of a decoding process according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 800, the system identifies a first element of a field. In some cases, the operations of this step may refer to, or be performed by, a table generation component as described with reference to FIG. 6.

At operation 805, the system generates a set of lookup tables for multiplying the first element. In some cases, the operations of this step may refer to, or be performed by, a table generation component as described with reference to FIG. 6.

At operation 810, the system splits a second element of the field into a set of sub-elements, where a number of the sub-elements equals a number of the lookup tables. In some cases, the operations of this step may refer to, or be performed by, a multiplication component as described with reference to FIG. 6.

At operation 815, the system identifies a summation term from each of the set of lookup tables based on each of the set of sub-elements. In some cases, the operations of this step may refer to, or be performed by, a lookup component as described with reference to FIG. 6.

At operation 820, the system computes a product of the first element and the second element by summing each of the summation terms. In some cases, the operations of this step may refer to, or be performed by, a multiplication component as described with reference to FIG. 6.

At operation 825, the system decodes information based on the product of the first element and the second element. In some cases, the operations of this step may refer to, or be performed by, a decoder as described with reference to FIG. 6.

Accordingly, the present disclosure includes the following embodiments.

A method for low power error correction coding (ECC) for embedded universal flash storage (EUFS) is described. Embodiments of the method may include identifying a first element of a field, generating a plurality of lookup tables for multiplying the first element, splitting a second element of the field into a plurality of sub-elements, wherein a number of the sub-elements equals a number of the lookup tables, identifying a summation term from each of the plurality of lookup tables based on each of the plurality of sub-elements, computing a product of the first element and the second element by summing each of the summation terms, and encoding information based on the product of the first element and the second element.

An apparatus for low power ECC for EUFS is described. The apparatus may include a processor, memory in electronic communication with the processor, and instructions stored in the memory. The instructions may be operable to cause the processor to identify a first element of a field, generate a plurality of lookup tables for multiplying the first element, split a second element of the field into a plurality of sub-elements, wherein a number of the sub-elements equals a number of the lookup tables, identify a summation term from each of the plurality of lookup tables based on each of the plurality of sub-elements, compute a product of the first element and the second element by summing each of the summation terms, and encode information based on the product of the first element and the second element.

A non-transitory computer readable medium storing code for low power ECC for EUFS is described. In some examples, the code comprises instructions executable by a processor to: identify a first element of a field, generate a plurality of lookup tables for multiplying the first element, split a second element of the field into a plurality of sub-elements, wherein a number of the sub-elements equals a number of the lookup tables, identify a summation term from each of the plurality of lookup tables based on each of the plurality of sub-elements, compute a product of the first element and the second element by summing each of the summation terms, and encode information based on the product of the first element and the second element.

Some examples of the method, apparatus, non-transitory computer readable medium, and system described above may further include splitting a third element of the field into another plurality of subsequent sub-elements, wherein a number of the additional sub-elements equals the number of the lookup tables. Some examples may further include identifying a subsequent summation term from each of the plurality of lookup tables based on each of the plurality of subsequent sub-elements. Some examples may further include computing a product of the first element and the third element by summing each of the summation terms, wherein the information is encoded based on the product of the first element and the third element.

In some examples, each of the summation terms comprises a sum of products of the first element with a coefficient from a set of coefficients. In some examples, the plurality of lookup tables are generated using a Gray code. In some examples, a number of bits of the first element is equal to a number of bits of the second element. In some examples, the number of the plurality of lookup tables is based at least in part on a number of bits of the first element.

In some examples, the summation term is identified from each of the plurality of tables using a corresponding sub-element of the plurality of sub-elements as an index. In some examples, the encoding is based on an algebraic ECC scheme. Some examples of the method, apparatus, non-transitory computer readable medium, and system described above may further include programming the encoded information to a memory.

Some examples of the method, apparatus, non-transitory computer readable medium, and system described above may further include splitting a third element of the field into another plurality of subsequent sub-elements, wherein a number of the additional sub-elements equals the number of the lookup tables. Some examples may further include identifying a subsequent summation term from each of the plurality of lookup tables based on each of the plurality of subsequent sub-elements. Some examples may further include computing a product of the first element and the third element by summing each of the summation terms, wherein the information is encoded based on the product of the first element and the third element.

In some examples, the plurality of lookup tables are generated using a Gray code. Some examples of the method, apparatus, non-transitory computer readable medium, and system described above may further include reading the information from a memory prior to the decoding. In some examples, the decoding is based on an algebraic ECC scheme.

Some examples of the apparatus, system, and method described above may further include a decoder configured to encode information based on an output of the multiplication component. In some examples, the multiplication component is configured to compute a plurality of products of the first element based on the lookup tables.

Some examples of the apparatus, system, and method described above may further include a programming component configured to program the encoded information to the memory. In some examples, the plurality of lookup tables are generated using a Gray code. In some examples, the lookup component is configured to identify the summation term from each of the plurality of tables using a corresponding sub-element of the plurality of sub-elements as an index.

The description and drawings described herein represent example configurations and do not represent all the implementations within the scope of the claims. For example, the operations and steps may be rearranged, combined or otherwise modified. Also, structures and devices may be represented in the form of block diagrams to represent the relationship between components and avoid obscuring the described concepts. Similar components or features may have the same name but may have different reference numbers corresponding to different figures.

Some modifications to the disclosure may be readily apparent to those skilled in the art, and the principles defined herein may be applied to other variations without departing from the scope of the disclosure. Thus, the disclosure is not limited to the examples and designs described herein, but is to be accorded the broadest scope consistent with the principles and novel features disclosed herein.

The described methods may be implemented or performed by devices that include a general-purpose processor, a digital signal processor (DSP), an application specific integrated circuit (ASIC), a field programmable gate array (FPGA) or other programmable logic device, discrete gate or transistor logic, discrete hardware components, or any combination thereof. A general-purpose processor may be a microprocessor, a conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Thus, the functions described herein may be implemented in hardware or software and may be executed by a processor, firmware, or any combination thereof. If implemented in software executed by a processor, the functions may be stored in the form of instructions or code on a computer-readable medium.

Computer-readable media includes both non-transitory computer storage media and communication media including any medium that facilitates transfer of code or data. A non-transitory storage medium may be any available medium that can be accessed by a computer. For example, non-transitory computer-readable media can comprise random access memory (RAM), read-only memory (ROM), electrically erasable programmable read-only memory (EEPROM), compact disk (CD) or other optical disk storage, magnetic disk storage, or any other non-transitory medium for carrying or storing data or code.

Also, connecting components may be properly termed computer-readable media. For example, if code or data is transmitted from a website, server, or other remote source using a coaxial cable, fiber optic cable, twisted pair, digital subscriber line (DSL), or wireless technology such as infrared, radio, or microwave signals, then the coaxial cable, fiber optic cable, twisted pair, DSL, or wireless technology are included in the definition of medium. Combinations of media are also included within the scope of computer-readable media.

In this disclosure and the following claims, the word "or" indicates an inclusive list such that, for example, the list of X, Y, or Z means X or Y or Z or XY or XZ or YZ or XYZ. Also the phrase "based on" is not used to represent a closed set of conditions. For example, a step that is described as "based on condition A" may be based on both condition A and condition B. In other words, the phrase "based on" shall be construed to mean "based at least in part on." Also, the words "a" or "an" indicate "at least one."

What is claimed is:
1. A method of processing data, comprising:
receiving a command to write information in a flash memory device;
identifying a first element of an algebraic field;
generating a plurality of lookup tables for multiplying the first element;
multiplying the first element by a plurality of additional elements of the algebraic field, wherein the multiplication for each of the additional elements is performed using, an element from each of the lookup tables;

encoding the information according to an error correction code (ECC) based on the multiplication; and
programming the information in the flash memory device based on the encoding in response to the command.

2. The method of claim 1, wherein the multiplying further comprises:
splitting a second element of the algebraic field into a plurality of sub-elements, wherein a number of the sub-elements equals a number of the lookup tables;
identifying a summation term from each of the plurality of lookup tables based on a corresponding sub-element from of the plurality of sub-elements; and
computing a product of the first element and the second element by summing each of the summation terms.

3. The method of claim 2, further comprising:
splitting a third element of the algebraic field into another plurality of subsequent sub-elements, wherein a number of the additional sub-elements equals the number of the lookup tables;
identifying a subsequent summation term from each of the plurality of lookup tables based on each of the plurality of subsequent sub-elements; and
computing a product of the first element and the third element by summing each of the summation terms, wherein the information is encoded based on the product of the first element and the third element.

4. The method of claim 2, wherein:
each of the summation terms comprises a sum of products of the first element with a coefficient from a set of coefficients.

5. The method of claim 2, wherein:
a number of bits of the first element is equal to a number of bits of the second element.

6. The method of claim 2, wherein:
the summation term is identified from each of the plurality of tables using a corresponding sub-element of the plurality of sub-elements as an index.

7. The method of claim 1, wherein:
the number of the plurality of lookup tables is based at least in part on a number of bits of the first element.

8. The method of claim 1, wherein:
the encoding is based on an algebraic ECC scheme.

9. The method of claim 1, further comprising:
programming the encoded information to a memory.

10. A method of processing data, comprising:
receiving a command to read information from a flash memory device;
reading information from the flash memory device;
identifying a first element of an algebraic field;
generating a plurality of lookup tables for multiplying the first element;
splitting a second element of the algebraic field into a plurality of sub-elements, wherein a number of the sub-elements equals a number of the lookup tables;
identifying a summation term from each of the plurality of lookup tables based on each of the plurality of sub-elements;
computing a product of the first element and the second element by summing each of the summation terms;
decoding the information based on the product of the first element and the second element; and
transmitting the information based on the decoding in response to the command.

11. The method of claim 10, further comprising:
splitting a third element of the algebraic field into another plurality, of subsequent sub-elements, wherein a number of the additional sub-elements equals the number of the lookup tables;
identifying a subsequent summation term from each of the plurality of lookup to based on each of the plurality of subsequent sub-elements; and
computing a product of the first element and the third element by summing each of the summation terms, wherein the information is encoded based on the product of the first element and the third element.

12. The method of claim 10, wherein:
the plurality of lookup tables are generated using a Gray code.

13. The method of claim 10, further comprising:
reading the information from a memory prior to the decoding.

14. The method of claim 10, wherein:
the decoding is based on an algebraic ECC scheme.

15. An apparatus for processing data, comprising:
a processor;
a memory;
a table generation component configured to generate a plurality of lookup tables for multiplying a first element;
a lookup component configured to split a second element of an algebraic field into a plurality of sub-elements, and identify a summation term from each of the plurality of lookup tables based on each of the plurality of sub-elements;
a multiplication component configured to compute a product of the first element and the second element by summing each of the summation terms;
an encoder configured to encode information based on the product of the first element and the second element or a decoder configured to decode the information based on the product of the first element and the second element; and
a programming component configured to program the encoded information to the memory.

16. The apparatus of claim 15, further comprising:
a decoder configured to encode information based on an output of the multiplication component.

17. The apparatus of claim 15, wherein:
the multiplication component is configured to compute a plurality of products of the first element based on the lookup tables.

18. The apparatus of claim 15, wherein:
the plurality, of lookup tables are generated using a Gray code.

19. The apparatus of claim 15, wherein:
the lookup component is configured to identify the summation term from each of the plurality of tables using a corresponding sub-element of the plurality of sub-elements as an index.

* * * * *